(12) United States Patent
Kuntz

(10) Patent No.: US 9,769,949 B1
(45) Date of Patent: Sep. 19, 2017

(54) MOBILE VIDEO, AUDIO, AND SENSORY APPARATUS

(71) Applicant: Steven T. Kuntz, San Juan Capistrano, CA (US)

(72) Inventor: Steven T. Kuntz, San Juan Capistrano, CA (US)

( * ) Notice: Subject to any disclaimer, the term of this patent is extended or adjusted under 35 U.S.C. 154(b) by 258 days.

(21) Appl. No.: 14/463,864

(22) Filed: Aug. 20, 2014

Related U.S. Application Data

(60) Provisional application No. 61/868,065, filed on Aug. 20, 2013.

(51) Int. Cl.
*H02J 9/00* (2006.01)
*H04N 7/18* (2006.01)
*H05K 7/16* (2006.01)

(52) U.S. Cl.
CPC ............. *H05K 7/16* (2013.01); *H02J 9/00* (2013.01); *H04N 7/18* (2013.01)

(58) Field of Classification Search
CPC ...... F16M 11/38; F16M 11/28; F16M 11/126; F16M 11/10; F16M 11/42; F16M 11/18; F16M 2200/061; F16M 13/00; F16M 11/04; F16M 11/046; F16M 11/043; G08B 13/19632
USPC ......... 248/685, 682, 149, 176.3, 422, 440.1; 348/143, 144, 148, 153, 154, 155, 158
See application file for complete search history.

(56) References Cited

U.S. PATENT DOCUMENTS

| | | | |
|---|---|---|---|
| 4,558,648 A * | 12/1985 | Franklin | ................. B66F 7/065 108/136 |
| 4,899,097 A | 2/1990 | Chapman | |
| 5,671,932 A | 9/1997 | Chapman | |
| 5,704,623 A | 1/1998 | Chapman | |
| 5,820,088 A | 10/1998 | Chapman | |
| 6,086,207 A | 7/2000 | Chapman | |
| 6,109,626 A | 8/2000 | Chapman | |
| 6,517,207 B2 | 2/2003 | Chapman | |
| 6,705,773 B2 | 3/2004 | Fix | |
| 6,776,488 B2 | 8/2004 | Burbulla | |
| 7,209,176 B2 | 4/2007 | Chapman | |
| 8,282,213 B2 | 10/2012 | Chapman | |
| 8,322,858 B2 | 12/2012 | Chapman | |
| 8,333,520 B1 | 12/2012 | Cronin | |

(Continued)

FOREIGN PATENT DOCUMENTS

| | | | |
|---|---|---|---|
| DE | 102009044220 | 7/2011 | |
| FR | WO 2005099029 A1 * | 10/2005 | ........... H01Q 1/1235 |

(Continued)

OTHER PUBLICATIONS

Revo Quad Skate Tabletop Dolly & Articulating Arm Kit, B & H, retrieved on Sep. 23, 2013 from http://www.bhphotovideo.com/c/product/999686-REG/revo_scaled_skter_dly_w.html.

*Primary Examiner* — Jayprakash N Gandhi
*Assistant Examiner* — Stephen Sul
(74) *Attorney, Agent, or Firm* — Donald E. Stout; Stout, Uxa & Buyan, LLP

(57) ABSTRACT

A self-contained mobile surveillance apparatus has applicability in a variety of short or long term settings where security and documentation of activities are needed. Integral to the apparatus is a gas shock assisted swing arm lift assembly and a removable quick connect pod platform system for use in acquiring, recording, storing, and transmitting data to one or more receive locations.

17 Claims, 3 Drawing Sheets

(56) References Cited

U.S. PATENT DOCUMENTS

| | | | | |
|---|---|---|---|---|
| 2003/0197110 A1* | 10/2003 | Cui | ........................ | B25J 9/1065 |
| | | | | 248/585 |
| 2005/0179539 A1* | 8/2005 | Hill | ................... | G08B 13/19632 |
| | | | | 340/539.1 |
| 2007/0252067 A1* | 11/2007 | Lee | ......................... | F16B 7/105 |
| | | | | 248/407 |
| 2010/0166411 A1* | 7/2010 | Gladstone | ............. | B66F 11/048 |
| | | | | 396/419 |
| 2010/0277584 A1* | 11/2010 | Price | ..................... | F16M 11/18 |
| | | | | 348/143 |
| 2012/0168576 A1* | 7/2012 | Intravatola | ............. | F16M 11/10 |
| | | | | 248/125.8 |
| 2012/0188082 A1* | 7/2012 | Berglund | ........... | G08B 13/1445 |
| | | | | 340/568.2 |
| 2012/0199544 A1* | 8/2012 | Aus | ......................... | B66C 23/64 |
| | | | | 212/299 |
| 2012/0291847 A1* | 11/2012 | Rowe, Jr. | ................. | H02S 30/20 |
| | | | | 136/245 |
| 2013/0133512 A1 | 5/2013 | Mueller | | |
| 2013/0134009 A1 | 5/2013 | Mueller | | |
| 2013/0183028 A1 | 7/2013 | Chapman | | |
| 2014/0103179 A1* | 4/2014 | Lipke | ....................... | H02G 3/14 |
| | | | | 248/231.91 |

FOREIGN PATENT DOCUMENTS

| | | |
|---|---|---|
| GB | 2485262 | 5/2012 |
| WO | 2005054112 | 6/2005 |

\* cited by examiner

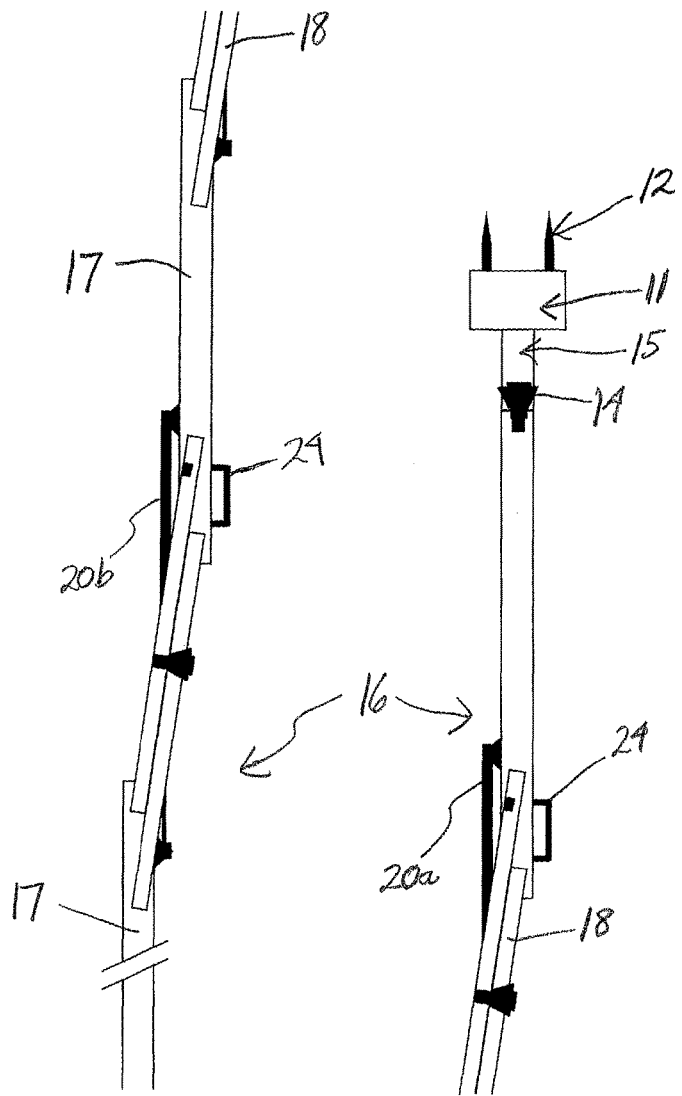

MOBILE VIDEO, AUDIO, AND SENSORY APPARATUS

This application claims the benefit under 35 U.S.C. 119(e) of the filing date of Provisional U.S. Application Ser. No. 61/868,065, entitled Mobile Video, Audio, and Sensory Apparatus, filed on Aug. 20, 2013, which is commonly assigned and herein expressly incorporated by reference, in its entirety.

BACKGROUND OF THE INVENTION

The present invention relates generally to devices, systems and methods for maintaining security at large public and private events. More specifically, the present invention relates to a mobile video/audio/sensor apparatus for use in acquiring, recording, storing and transmitting video, audio, and sensor data to security staff at such events.

Currently, there are trailer platforms in various sizes and functionality that offer a similar solution to this invention. Platforms of this type are shown in Published U.S. Patent Application No. 2010/0277584. The aforementioned published patent application is herein expressly incorporated by reference, in its entirety. In addition, there are various tripod and tower assemblies on the market that provide somewhat similar functionality. Current trailer platforms are large and difficult to transport. Also, their mast, cables, and electronics assemblies damage easily and cause inefficiency during set up.

SUMMARY OF THE INVENTION

A problem solved by the invention is the ability of the operator to monitor and record events in multiple locations in real time. Utilizing the video, audio, and sensor capabilities of the invention, the user or users may perform surveillance in a large area. This allows law enforcement, security, medical or event staff the ability to monitor a given area more efficiently and cost effectively than the current state of the art. This invention becomes a force multiplier for law enforcement, event, medical, security, or any other authorized personnel responsible for the security and safety of the general public. Also, due to the lack of physical size, the invention may be placed in smaller places quickly and less conspicuously than the current state of the art systems.

The present invention is a self-contained mobile apparatus that has applicability in a variety of short or long term settings where security and documentation of activities are needed. Integral to the apparatus is a gas shock assisted swing arm lift assembly and a removable quick connect pod platform system for use in acquiring, recording, storing, and transmitting data to one or more receive locations.

More particularly, in one aspect of the invention there is provided a mobile security apparatus, which comprises a main battery and electronics platform and a mast assembly extending upwardly from the main battery and electronics platform. The mast assembly comprises a plurality of mast segments which are joined together lengthwise by pivot joints. All or some of the mast segments may be moved between a folded transport or storage configuration, wherein the mast segments are pivoted to an orientation such that they are folded together in a relative compact arrangement and further wherein at least some of the mast segments are pivoted and extended to an orientation such that the mast assembly is in an extended deployed configuration, so that the upper end of the mast assembly is at an extended height. An electronics pod assembly is connected to the upper end of the mast assembly. The electronics pod assembly has sensors and electronics disposed therein. A latch connects the electronics pod assembly to the upper end of the mast assembly in a readily releasable manner, so that the electronics pod assembly may be quickly removed and replaced with a different electronics pod assembly without disassembling other portions of the mobile security apparatus.

A mounting tube is disposed at a lower end of the electronics pod assembly, which is connectable to and releasable from the upper end of the mast assembly by the latch. The upper end of the mast assembly comprises a mast tube, wherein the latch connects the mounting tube to the mast tube. Preferably, at least in some embodiments, the latch is lockable.

A portion of the mounting tube slides telescopically inside of the mast tube. Cable extends from the electronics pod assembly down into the mast tube for electronically connecting the electronics pod assembly to the main battery and electronics platform. The cable comprises a fitting for quickly detaching and attaching the electronics pod assembly to the remainder of the mobile security apparatus electronically when it is desired to remove or attach an electronics pod assembly from or to the mobile security apparatus.

The mast assembly further comprises at least one additional mast tube pivotally joined to the mast tube, and a plurality of arms pivotally mounted to the mast tubes to create a mechanism affording a maximized range of lift between a compact configuration and an extended configuration. The apparatus further comprises at least one gas spring for assisting the raising and lowering of the mast assembly between a compact and an extended configuration. A solar panel is mounted on an extendable arm and a gas spring is provided for assisting movement of the extendable arm to deploy the solar panel.

In another aspect of the invention, there is provided a mobile security apparatus which comprises a main battery and electronics platform and a mast assembly extending upwardly from the main battery and electronics platform. The mast assembly comprises a plurality of mast segments which are joined together lengthwise by pivot joints, so that all or some of the mast segments may be moved between a folded transport or storage configuration, wherein the mast segments are pivoted to an orientation such that they are folded together in a relative compact arrangement and further wherein at least some of the mast segments are pivoted and extended to an orientation such that the mast assembly is in an extended deployed configuration, so that the upper end of the mast assembly is at an extended height. An electronics pod assembly is connected to the upper end of the mast assembly. The electronics pod assembly has sensors and electronics disposed therein.

The mast assembly further comprises at least one additional mast tube pivotally joined to the mast tube, and a plurality of arms pivotally mounted to the mast tubes to create a mechanism affording a maximized range of lift between a compact configuration and an extended configuration. The apparatus additionally comprises at least one gas spring for assisting the raising and lowering of the mast assembly between a compact and an extended configuration.

A solar panel is mounted on an extendable arm and a gas spring for assisting movement of the extendable arm to deploy the solar panel. A latch is provided for connecting the electronics pod assembly to the upper end of the mast assembly in a readily releasable manner, so that the electronics pod assembly may be quickly removed and replaced with a different electronics pod assembly without disassembling other portions of the mobile security apparatus. The upper end of the mast assembly comprises a mast tube, wherein the latch connects the mounting tube to the mast tube. Preferably, the latch is lockable.

A portion of the mounting tube slides telescopically inside of the mast tube. A cable extends from the electronics box in the electronics pod assembly down into the mast tube for electronically connecting the electronics pod assembly to the main battery and electronics platform. The cable comprises a fitting for quickly detaching and attaching the electronics pod assembly to the remainder of the mobile security apparatus electronically when it is desired to remove or attach an electronics pod assembly from or to the mobile security apparatus.

In still another aspect of the invention, there is discloses a method for deploying and using a mobile security system, wherein the system comprises at least one apparatus having a main battery and electronics platform and a mast assembly extending upwardly from the main battery and electronics platform, the mast assembly comprising a plurality of mast segments which are joined together lengthwise by pivot joints. The method comprises steps of attaching a desired electronics pod assembly to an upper end of the mast assembly using a releasable latch, and actuating the mast assembly from a compact configuration to an extended configuration, wherein the electronics pod assembly is disposed at a desired height for use. The actuating step includes using gas springs to assist in moving articulated segments of the mast assembly from the compact configuration to the extended configuration. Advantageously, because of the modular construction of the present inventive system, a further method step comprises detaching the electronics pod assembly from the upper end of the mast assembly by releasing the latch, and then attaching a different electronics pod assembly to the upper end of the mast assembly using the releasable latch.

The invention, together with additional features and advantages thereof, may best be understood by reference to the following description taken in conjunction with the accompanying illustrative drawings.

BRIEF DESCRIPTION OF THE DRAWINGS

FIG. 3 is a side view of the device of FIG. 1, wherein the swing arm has been fully deployed.

DETAILED DESCRIPTION OF THE INVENTION

Figure 1:
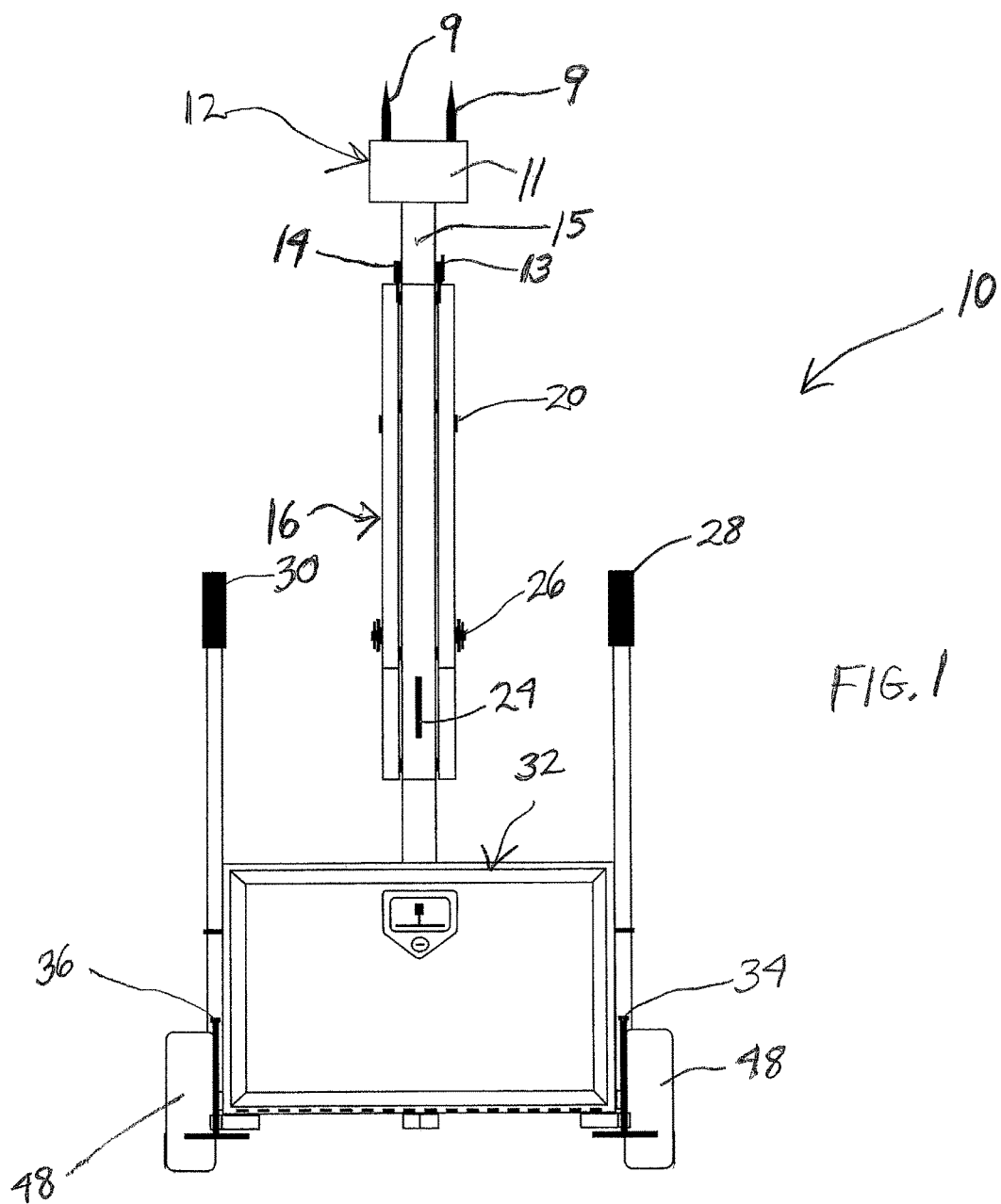
FIG. 1 is a front view of an embodiment of a device constructed in accordance with the principles of the present invention.

Referring now more particularly to the drawings, one embodiment of a surveillance apparatus 10 constructed in accordance with the principles of the present invention is illustrated. In FIG. 1, an electronics pod assembly 12, constructed in accordance with the principles of the present invention, is shown. The electronics pod assembly 12, in the illustrated embodiment, comprises an electronics box 11, antennas 9, and a mounting tube 15, to be described further hereinbelow. This particular construction is not significant—the electronics pod assembly 12 may take on any suitable configuration for housing desired sensor equipment, such as recording devices (e.g. video recording devices), GPS-locators, or any other type of sensor, as well as associated communications and electronics equipment for controlling operation of the sensor equipment and for communicating input and output signals to and from the electronics pod assembly 12. The antennas 9, for example, could instead be a radio, terrestrial-based or satellite-based. All of this connectivity is meant to provide the user with access to multiple apparatuses either locally (meaning physically where deployed), or remotely via the Internet and cloud for any other authorized user. In this application, we have focused on the security aspect, but since the video might also be used for awareness or promotion, it might be accessed by the public via the cloud if desired.

The electronics pod assembly 12, in one particular exemplary embodiment, comprises a piece of square aluminum tube with a piece of square aluminum tube slid inside of it. On one end, the inside tube extends past the outside tube by about one (1) inch. The other ends are flush, creating a tube wall having a combined thickness of the two tubes. The protruding end of the inside tube is cut and beveled at a 45 degree angle on each corner to allow the protruding portion to slide into the top of the mast assembly securely. The flush end has holes drilled and tapped in each corner to allow the electronics box to be mounted on top. This is the aforementioned mounting tube 15.

The electronics box portion 11 of the pod, in one particular embodiment, comprises two (2) top and bottom square plates and a center wall portion formed of aluminum. The edges of the center wall portion are tapped on both sides in the corners and midpoint of each side. The square plates have holes drilled in the corners and midpoint on each side so they can be mounted to the center wall portion. The center of the bottom plate is also drilled in a desired pattern to allow it to be mounted to the mounting tube 15 referenced above. This pattern also allows mounting of an electronics rack on the inside of the electronics box 11. The top plate can be used, as is, to close the top of the electronics box portion of the assembly. Alternatively, four (4)—"D" holes can be drilled in the top to accept antenna mounting connectors. Other holes are drilled in the sides of the electronics box 11 to accept various cameras, sensors or other devices.

Latches 13 and 14 are riveted, in one example, to the mounting tube 15, one of which latches is lockable. This allows the electronics pod to be securely mounted to the mast and prevents theft of the electronics.

Category 6e cable, or other suitable cable and/or wiring for a particular desired application, extends from the electronics box 11 down into the mounting tube 15 for connection to a mast assembly 16.

The main mast assembly 16 comprises, in the illustrated embodiment, three pieces of square aluminum tube 17. One piece is longer than the other two pieces, which are of substantially equal length.

Mast tubes are connected, again in one particular embodiment, to eight (8) arms 18 made of pieces of square aluminum tube. The geometry where the mast arms are mounted to the mast tube is precisely arranged to offer the largest range of lift possible.

Mast arms are mounted on center pivot points at two different locations from the top of the main and center mast tubes and at two different locations from the bottom of the center and front mast tubes, in the exemplary embodiment that is illustrated.

The mast tubes 17 are connected to the arms 18 with mechanical fasteners, such as bolts 18a. Low friction PTFE flat washers are installed between the mast tubes and arm tubes. Nylon general purpose flat washers are used under the bolt head and behind the nylon insert lock nut. The nylon insert nuts are tightened on the bolts to provide consistent tension on the arm joints. This combination of parts provides friction free mast arm rotation for extended life and consistent rigidity and performance.

Four (4) pass-through bolts on one side of the mast assembly have holes drilled in them to allow the category 6 cable used for power and communications to be protected inside the swing arm mast lift assembly.

Two (2) gas springs 20a, 20b are mounted to the main mast tubes 17 and provide lift assistance to lift the mast and pod assembly into place. In one particular example, the upper gas spring 20a has a smaller rating of 60 lb, for use with the upper mast and the lower gas spring 20b has a larger rating of 80 lb for use with the lower mast. The gas springs are connected to ball brackets which are mounted to the mast with high strength rivets. The aforementioned ratings are exemplary only, of course.

Four (4) latches and six (6) keepers are riveted to the mast arms 18 to lock the mast in place in either the transport (folded) or extended position. Two (2) of the latches feature locks to prevent unauthorized extending or lowering of the mast. When extended, this feature prevents removal and/or theft of the electronics pod. Two (2) additional keepers are riveted to the top end of the mast for connecting and securing the electronics pod assembly 12. The latches and keepers are mounted at precise locations on the mast arms so that a single latch can be used to secure each pair of mast arms in both the lowered and extended configuration. The latch keepers are mounted on the front arm of each pair at two different locations thereon. The latches are also mounted on the rear arm of each pair at two different locations spaced from the bottom of the arm.

In one particular illustrative embodiment, the mast can be raised to a height of nine (9) feet, nine (9) inches or fourteen (14) feet, one (1) inch not including the electronics pod. Mast handles 24 are mounted on the mast to assist in raising and lowering the assembly. A quick connect RJ 45 Ethernet connector is mounted in the top of the upper mast tube for connection of the disconnectable and interchangeable electronics pod assembly.

A particularly advantageous feature of this design, in certain applications, is the fact that all bolts and nuts are internal to the assembly and not accessible to the exterior of the assembly. This prevents tampering with the device along with corrosion resistance.

The main mast assembly comprises a plurality of aluminum arms, joined at pivot points 18a, discussed above, an exemplary one of which is shown in FIG. 2, which allow the arms 18 to expand when one or more of the gas springs 20a and 20b are activated to assist in deploying the mast. Deployment of the mast assembly is primarily performed through the use of the handles 24. Latch 26 is riveted to the mast arms to lock the mast in place and prevent unauthorized extending or lowering of the mast assembly.

Figure 2:
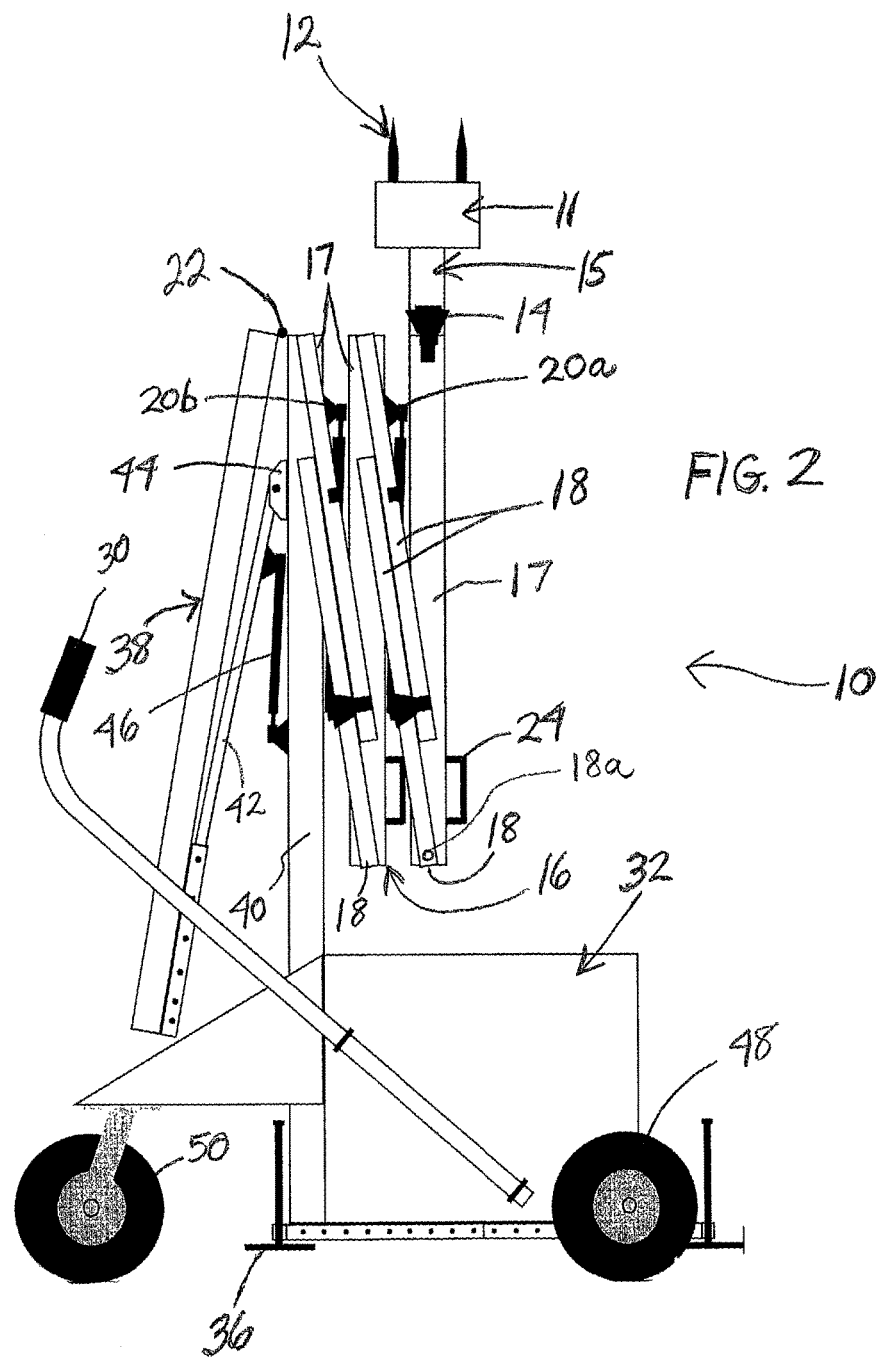
FIG. 2 is a side view of the device of FIG. 1 in an undeployed configuration.

As shown particularly in FIGS. 1 and 2, handles 28 and 30 comprise bent steel tubing mounted on each side of a main battery and electronics platform 32. Level supports 34 and 36 provide stability when the apparatus is in use, and are in place to prevent tipping or movement of the apparatus. The level supports are mounted to retractable square steel tubes that can be extended to provide a wide base platform for stability of the unit while the mast assembly is extended. The retractable square steel tubes slide into square steel tubes welded to the bottom of the platform 32. The platform 32 may contain up to three batteries or more, for powering the unit 10 without the need for connection to the power grid during operation.

The system shown and described herein further comprises a solar panel 38 (FIG. 2), which is supported on a support post 40 extending upwardly from the main battery and electronics platform 32. The solar panel 38 is attached to a distal end of an arm 42, which is connected to the post 40 via a pivot joint 44 and a hinge 22. A gas shock 46 is positioned and operable to allow the solar panel 38 to be easily raised and lowered to a desired angle without the user having to support the weight of the panel while putting the locking pin in place. Using the solar panel support system, the panel 38 may be oriented and positioned to maximize generated power. Depending upon location and weather, the presence of the solar panel may allow for indefinite operation of the unit without the need to connect to the grid to recharge the batteries, as the batteries may be recharged by the solar panel each day.

For easy transportability, the apparatus 10 is wheeled. In the embodiment shown, there are two rear wheels 48 and a front wheel 50. Rear wheel supports may comprise, in one particular embodiment, triangle supports made for 16 GA steel with four bolt studs for mounting to the main battery/electronics box 32. Four bolt studs are provided for mounting the swivel wheels to triangle supports.

While particular embodiments, using particular components having specific sizes and being of specific materials, have been described and shown herein, it is to be understood by those skilled in the art that this is only for the purpose of providing a thorough description of the invention, as it may be constructed, and is by no means limited. Different components, materials, and sizes may be employed, as desired, depending upon application.

The inventive apparatus 10 may be used singly, but is particularly designed to be used in combination with one or more additional systems 10, as a group. In particular, multiple units 10 may be linked together via wireless radios to cover an intended area, such as a parking lot, city block, park, public venue, shopping center, stadium, warehouse or storage facility, and the like. This allows the system to be a force multiplier for law enforcement or event organizers.

The base unit 32, with associated wheels or alternative stand, may be provided separately from the quick-connect interchangeable pod assemblies 12. This allows the user to purchase a number of bases 32 optimal for their requirements, and to then purchase pods 12 depending upon application. Since the pod connections are all designed to be the same, based upon PoE (Power over Ethernet), PoE+, and High PoE technology, a user may have multiple pods for a single base unit.

PoE is central to the design, as it provides flexibility for the multiple pods 12. The original PoE standard provides up to 15.4 W of DC power (minimum 44 V DC and 350 mA) to each pod 12. Only 12.95 W is assured to be available at the powered device as some power is dissipated in the cable. The updated PoE+ standard provides up to 25.5 W of power. The 2009 standard prohibits a powered device from using all four pairs for power.

It is also possible to provide higher power levels from non-standard devices for products (like lights) that may require more power. The use of PoE, PoE+, and High PoE should not limit the applications of the base units for powering devices.

FIG. 3 particularly illustrates the system 10 of the present invention with the mast assembly 16 in its fully extended position. Because of page size limitations, the distal (upper) end of the mast assembly is shown on the right, while the proximal (lower) end of the mast assembly is shown on the left. The upper portion of the left hand side of the assembly, as depicted, in reality is connected to the lower portion of the right hand side of the assembly.

Accordingly, although an exemplary embodiment of the invention has been shown and described, it is to be understood that all the terms used herein are descriptive rather than limiting, and that many changes, modifications, and substitutions may be made by one having ordinary skill in the art without departing from the spirit and scope of the invention.

What is claimed is:

1. A mobile security apparatus, comprising:
   a main battery and electronics platform;
   a swing arm mast assembly extending upwardly from the main battery and electronics platform, comprising a plurality of mast segments which are joined together, so that all or some of the mast segments may be moved between a folded transport or storage configuration, wherein the mast segments are pivoted to an orientation such that they are folded together in a relative compact arrangement and further wherein at least some of the mast segments are pivoted and extended to an orientation such that the swing arm mast assembly is in an extended deployed configuration, so that the upper end of the swing arm mast assembly is at an extended height, wherein each mast segment comprises a mast tube, the swing arm mast assembly further comprising a plurality of extendable arms which pivotally join the mast tubes of at least some of the mast segments together and a plurality of gas springs which are connected to a plurality of the mast tubes, the plurality of gas springs being actuatable to swing the mast tubes outwardly and upwardly in a non-telescoping manner to the extended deployed configuration, and also actuatable to swing the mast tubes downwardly to the relative compact arrangement;
   an electronics pod assembly connected to the upper end of the mast assembly, the electronics pod assembly having sensors and electronics disposed therein; and
   a latch which connects a mounting tube to the electronics pod assembly on the upper end of the mast apparatus in a readily releasable manner, so that the electronics pod assembly may be quickly removed and replaced with a different electronics pod assembly without disassembling other portions of the mobile security apparatus.

2. The mobile security apparatus as recited in claim 1, wherein the mounting tube is disposed at a lower end of the electronics pod assembly, and the mounting tube being connectable to and releasable from the upper end of the swing arm mast assembly by the latch.

3. The mobile security apparatus as recited in claim 2, wherein the latch is lockable.

4. The mobile security apparatus as recited in claim 2, wherein the portion of the mounting tube slides telescopically inside the upper end mast tube.

5. The mobile security apparatus as recited in claim 2, and further comprising a cable extending from the electronics pod assembly down into the upper end mast tube for electronically connecting the electronics pod assembly to the main battery and electronics platform.

6. The mobile security apparatus as recited in claim 5, wherein the cable comprises a fitting for quickly detaching and attaching the electronics pod assembly to the remainder of the mobile security apparatus electronically when it is desired to remove or attach an electronics pod assembly from or to the mobile security apparatus.

7. The mobile security apparatus as recited in claim 1, and further comprising a solar panel mounted on one of the extendable arms, wherein one of said gas springs assists movement of the solar panel to a deployed orientation.

8. A mobile security apparatus, comprising:
   a main battery and electronics platform;
   a mast assembly extending upwardly from the main battery and electronics platform, comprising a plurality of mast segments, wherein each mast segment comprises a mast tube, which are joined together lengthwise by pivot joints, so that all or some of the mast segments may be moved between a folded transport or storage configuration, wherein the mast segments are pivoted to an orientation such that they are folded together in a relative compact arrangement and further wherein at least some of the mast segments are pivoted and extended to an orientation such that the mast assembly is in an extended deployed configuration, so that the upper end of the mast assembly is at an extended height;
   an electronics pod assembly connected to the upper end of the mast assembly by a mounting tube, the electronics pod assembly having sensors and electronics disposed therein; and a plurality of arms pivotally mounted to the mast tubes to create a mechanism affording a maximized range of lift between a compact configuration and an extended configuration, the apparatus further comprising at least one gas spring for assisting the raising and lowering of the mast assembly between a compact and an extended configuration.

9. The mobile security apparatus as recited in claim 8, and further comprising a solar panel mounted on an extendable arm and a gas spring for assisting movement of the extendable arm to deploy the solar panel.

10. The mobile security apparatus as recited in claim 8, and further comprising a latch for connecting the electronics pod assembly to the upper end of the mast assembly in a readily releasable manner, so that the electronics pod assembly may be quickly removed and replaced with a different electronics pod assembly without disassembling other portions of the mobile security apparatus.

11. The mobile security apparatus as recited in claim 10, the upper end of the mast assembly comprising the mast tube, wherein the latch connects the mounting tube to the mast tube.

12. The mobile security apparatus as recited in claim 11, wherein the latch is lockable.

13. The mobile security apparatus as recited in claim 11, wherein a portion of the mounting tube slides telescopically inside of the mast tube.

14. The mobile security apparatus as recited in claim 11, and further comprising cable extending from the electronics pod assembly down into the mast tube for electronically connecting the electronics pod assembly to the main battery and electronics platform.

15. The mobile security apparatus as recited in claim 14, wherein the cable comprises a fitting for quickly detaching and attaching the electronics pod assembly to the remainder of the mobile security apparatus electronically when it is desired to remove or attach an electronics pod assembly from or to the mobile security apparatus.

16. A method for deploying and using a mobile security system comprising at least one apparatus having a main battery and electronics platform and a mast assembly extending upwardly from the main battery and electronics platform, comprising a plurality of mast segments which are joined together lengthwise by pivot joints; the method comprising:

attaching a desired electronics pod assembly to a mounting tube, to then be disposed on an upper end of the mast assembly using a releasable latch;

and actuating the mast assembly from a compact configuration to an extended configuration, wherein the electronics pod assembly is disposed at a desired height for use, the actuating step including using gas springs to assist in moving articulated segments of the mast assembly from the compact configuration to the extended configuration.

17. The method as recited in claim 16, and further comprising:

actuating the mast assembly from its extended configuration to its compact configuration;

detaching the electronics pod assembly from the upper end of the mast assembly by releasing the latch;

attaching a different electronics pod assembly to the upper end of the mast assembly using said releasable latch; and actuating the mast assembly from its compact configuration to its extended configuration, wherein the different electronics pod assembly is disposed at a desired height for use.

\* \* \* \* \*